United States Patent
Osswald et al.

(10) Patent No.: US 12,126,202 B2
(45) Date of Patent: Oct. 22, 2024

(54) METHOD FOR DETECTING ELECTRICAL FAULT STATES OF A REMOVABLE BATTERY PACK AND SYSTEM FOR CARRYING OUT THE METHOD

(71) Applicant: Robert Bosch GmbH, Stuttgart (DE)

(72) Inventors: Alexander Osswald, Stuttgart (DE); Christoph Klee, Stuttgart (DE); Marc-Alexandre Seibert, Stuttgart (DE); Mickael Segret, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 433 days.

(21) Appl. No.: 17/380,433

(22) Filed: Jul. 20, 2021

(65) Prior Publication Data

US 2022/0029437 A1    Jan. 27, 2022

(30) Foreign Application Priority Data

Jul. 24, 2020 (DE) ..................... 10 2020 209 397.0

(51) Int. Cl.
*H02J 7/00* (2006.01)
*G01R 31/3835* (2019.01)
*H01M 10/44* (2006.01)

(52) U.S. Cl.
CPC ........ *H02J 7/0047* (2013.01); *G01R 31/3835* (2019.01); *H01M 10/443* (2013.01); *H02J 7/0031* (2013.01); *H01M 2220/30* (2013.01)

(58) Field of Classification Search
None
See application file for complete search history.

(56) References Cited

U.S. PATENT DOCUMENTS

| | | | | |
|---|---|---|---|---|
| 2005/0242667 | A1* | 11/2005 | Emori | B60L 58/15 307/10.1 |
| 2008/0259656 | A1* | 10/2008 | Grant | H02M 3/33523 363/21.18 |
| 2010/0085012 | A1* | 4/2010 | Cruise | H02J 7/007194 320/155 |
| 2011/0254508 | A1* | 10/2011 | Sakakibara | H01M 10/441 320/118 |

(Continued)

FOREIGN PATENT DOCUMENTS

| | | |
|---|---|---|
| DE | 10 2015 218 447 A1 | 6/2016 |
| DE | 10 2016 209 822 A1 | 12/2017 |
| WO | 2020/043386 A1 | 3/2020 |

*Primary Examiner* — Edward Tso
*Assistant Examiner* — Ahmed H Omar
(74) *Attorney, Agent, or Firm* — Maginot, Moore & Beck LLP

(57) ABSTRACT

A method detects electrical fault states of a removable battery pack. Cell voltage values of a plurality of energy storage cells of the removable battery pack are detected by a first monitoring unit integrated in the removable battery pack and a voltage of the removable battery pack is detected by a further monitoring unit integrated in an electrical device, in particular a charging device, a diagnostic device or an electrical consumer, that can be connected to the removable battery pack. The cell voltage values detected by the first monitoring unit are transmitted to the further monitoring unit. The further monitoring unit sums the cell voltage values and compares this with the voltage value of the removable battery pack.

11 Claims, 3 Drawing Sheets

(56) References Cited

U.S. PATENT DOCUMENTS

| | | | | |
|---|---|---|---|---|
| 2013/0285600 | A1* | 10/2013 | Ishikawa | H01M 10/48 320/107 |
| 2014/0042981 | A1* | 2/2014 | Kaizo | H02J 7/007182 320/136 |
| 2014/0167778 | A1* | 6/2014 | Todani | G01R 31/3835 324/434 |
| 2014/0300366 | A1* | 10/2014 | Kobayakawa | H01M 10/482 324/433 |
| 2014/0301000 | A1* | 10/2014 | Takahashi | H01M 10/482 361/42 |
| 2015/0333301 | A1* | 11/2015 | Ota | H02J 7/0063 429/91 |
| 2016/0359343 | A1* | 12/2016 | Ito | H02J 7/0029 |
| 2017/0353041 | A1* | 12/2017 | Klee | B25F 5/02 |
| 2018/0099394 | A1* | 4/2018 | Ichikawa | B25D 17/043 |

* cited by examiner

METHOD FOR DETECTING ELECTRICAL FAULT STATES OF A REMOVABLE BATTERY PACK AND SYSTEM FOR CARRYING OUT THE METHOD

This application claims priority under 35 U.S.C. § 119 to patent application no. DE 10 2020 209 397.0, filed on Jul. 24, 2020 in Germany, the disclosure of which is incorporated herein by reference in its entirety.

The disclosure relates to a method for detecting electrical fault states of a removable battery pack, wherein the cell voltage values of a plurality of energy storage cells of the removable battery pack are detected by a first monitoring unit integrated in the removable battery pack and wherein a voltage of the removable battery pack is detected by a further monitoring unit integrated in an electrical device, in particular a charging device, a diagnostic device or an electrical consumer, that can be connected to the removable battery pack. The disclosure further relates to a system for carrying out the method.

BACKGROUND

A multiplicity of electrical consumers are operated using battery packs that can be removed without tools by the operator—referred to as removable battery packs in the following text—and that are discharged accordingly by the electrical consumer and can be recharged again by means of a charging device. Such removable battery packs usually consist of a plurality of energy storage cells interconnected in series and/or in parallel for achieving a requested removable battery pack voltage or capacity. If the energy storage cells are designed as lithium-ion cells (Li-ion), for example, a high power and energy density can particularly advantageously be achieved. On the other hand, to prevent electrical fault states, such cells also require compliance with strict specifications regarding the maximum charging and discharge current, the voltage and the temperature.

In modern removable battery packs, the cell voltage of the parallel-connected energy storage cells of what is known as a cell cluster is evaluated, for example, by a monitoring unit integrated in the removable battery pack. The term "cell voltage" should accordingly be understood not only as the voltage of an individual energy storage cell but also that of a cell cluster consisting of parallel-interconnected energy storage cells. So-called single cell monitoring (SCM) of this type is known, for example, from WO 20043386 A1, in which dangerous operation of the removable battery pack in the event of a fault is precluded by redundant monitoring.

In order for a charging device or an electrical consumer to know with which charging or discharge current a removable battery pack may be operated at a maximum, this is generally communicated by electrical coding, for example by coding resistors integrated in the removable battery pack that are measured by the electrical device and compared with a stored table, mechanical coding or a communication interface. DE 10 2016 209 822 A1 likewise discloses that the electrical device communicates to the removable battery pack that it may not continue to be used. The cell voltages can also be transmitted to the device via such an interface.

Proceeding from the prior art, it is the object of the disclosure to further improve the identification of fault states in a removable battery pack in order to ensure safe charging or discharging of the removable battery pack.

SUMMARY

According to the disclosure, provision is made, in a method step, for the cell voltage values detected by the first monitoring unit to be transmitted to the further monitoring unit, wherein the further monitoring unit sums the cell voltage values and compares this with the voltage value of the removable battery pack. It is thus particularly advantageously possible to achieve safe charging or discharging without additional hardware outlay by way of a plausibility check of the detected voltage values since the generally already present electronic components of the removable battery pack and electrical device monitor one another.

In the context of the disclosure, electrical consumers should be understood to mean, for example, power tools operated using a removable battery pack for performing work on workpieces by means of an electrically driven insert tool. The power tool may in this case be realized both as a hand-held power tool and as a floor-standing power tool. Typical power tools in this context are hand-held or floor-standing drills, screwdrivers, impact drills, hammer drills, planers, angle grinders, orbital sanders, polishing machines, circular, bench, miter and jig saws or the like. However, gardening appliances operated using a removable battery pack such as lawn mowers, lawn trimmers, pruning saws or the like and also domestic appliances operated using a removable battery pack such as vacuum cleaners, mixers, etc., may also be included under the term electrical consumer. The disclosure can likewise be applied to electrical consumers that are supplied with power using a plurality of removable battery packs at the same time.

The voltage of a removable battery pack is generally a multiple of the voltage of an individual energy storage cell and results from the interconnection (in parallel or in series) of the individual energy storage cells. An energy storage cell is typically designed as a galvanic cell, which has a structure in which one cell pole comes to lie at one end and a further cell pole comes to lie at an opposite end. In particular, the energy storage cell at one end has a positive cell pole and at an opposite end a negative cell pole. The energy storage cells are preferably designed as lithium-based energy storage cells, for example Li-ion, Li—Po, Li-metal and the like. However, the disclosure can also be applied to removable battery packs with Ni—Cd, Ni-MH cells or other suitable cell types. In current Li-ion energy storage cells with a cell voltage of 3.6 V, for example voltage classes of 3.6 V, 7.2 V, 10.8 V, 14.4 V, 18 V, 36 V etc. are produced. An energy storage cell is preferably designed as an at least substantially cylindrical round cell, wherein the cell poles are arranged at ends of the cylinder shape. However, the disclosure is not dependent on the type and construction of the energy storage cells used but can be applied to any removable battery packs and energy storage cells, for example also pouch cells or the like in addition to round cells.

It should furthermore be noted that the configuration of the electromechanical interfaces of the removable battery packs and the electrical devices that can be connected thereto and also the associated receptacles for force-fitting and/or form-fitting detachable connection are not intended to be the subject of this disclosure. A person skilled in the art will select a suitable embodiment for the interface depending on the power or voltage class of the electrical device and/or the removable battery pack. The embodiments shown in the drawings are therefore to be understood as purely exemplary. It is thus possible, in particular, to also use interfaces having more than the illustrated electrical contacts.

In one configuration of the disclosure, provision is made, in a method step, for the further monitoring unit of the electrical device to evaluate the transmitted cell voltage values and, in the event that at least one of the cell voltage values exceeds a cell voltage threshold value, to terminate or reduce the charging or discharging process of the removable battery pack and/or to signal a fault state of the removable battery pack.

In a further method step of the method according to the disclosure, a temperature of the removable battery pack and/or of the energy storage cells is measured and evaluated by the further monitoring unit of the electrical device. Due to the additional consideration of the temperature values in addition to the detected voltage values, the safety of the charging or discharging process can be increased even further. In a method step, the further monitoring unit of the electrical device terminates the charging or discharging process of the removable battery pack or reduces the charging or discharge current and/or signals a fault state of the removable battery pack when the evaluated temperature value is outside of a permitted temperature range and/or the evaluated voltage value of the removable battery pack is outside of a permitted voltage range.

In a particularly advantageous way, the plausibility check of the voltage values detected in the removable battery pack and in the electrical device can be carried out in such a way that, in a method step, the further monitoring unit of the electrical device terminates or reduces the charging or discharging process of the removable battery pack and/or signals a fault state of the removable battery pack when the voltage value of the removable battery pack and the summed cell voltage values of the energy storage cells deviate from one another by more than a permissible voltage difference value, in particular by more than 1 V.

If the charging or discharging process is started, in a method step, the further monitoring unit of the electrical device can evaluate a charging or discharge current and, in the event that the charging or discharge current is outside a permitted current range and/or below a current threshold value, in particular below 100 mA per energy storage cell connected in parallel, can terminate or reduce the charging or discharging process of the removable battery pack and/or signal a fault state of the removable battery pack. In the event that no fault state has been identified in the previous method steps, the charging or discharging process is continued. In this case, the previous method steps are run through once more at time intervals of, for example, one minute. Continuous monitoring is therefore ensured. If there is still no fault state present after several runs through, the time intervals can be increased successively.

The disclosure also relates to a system comprising a removable battery back having a plurality of energy storage cells, having a first monitoring unit and having a first electromechanical interface having a plurality of electrical contacts, and also an electrical device, in particular a charging device, a diagnostic device or an electrical consumer, having a further monitoring unit and a further electromechanical interface having a plurality of electrical contacts, wherein in each case a first of the electrical contacts of the interfaces is designed as an energy supply contact that can be supplied with a first reference potential, preferably a supply potential, in each case a second of the electrical contacts of the interfaces is designed as an energy supply contact that can be supplied with a second reference potential, preferably a ground potential, and in each case a third of the electrical contacts of the interfaces is designed as a signal or data contact for data exchange of the first and the further monitoring unit. The electrical contacts of the first and the further interface are connected to one another in order to carry out the method according to the disclosure.

The removable battery pack also has at least one temperature sensor, wherein in each case a fourth of the electrical contacts of the interfaces is designed as a signal or data contact for transmitting a temperature signal of the temperature sensor to the further monitoring unit of the electrical device.

By means of a switching element, the first monitoring unit of the removable battery pack can connect the temperature sensor to the second reference potential of the second energy supply contact in the closed state of the switching element and disconnect it therefrom in the open state. In this way, the further monitoring unit of the electrical device can identify a fault state in the removable battery pack very easily and quickly.

Provision is furthermore made for the removable battery pack and/or the electrical device to each have an optical, acoustic and/or haptic signaling means for signaling the fault state.

BRIEF DESCRIPTION OF THE DRAWINGS

The disclosure is explained by way of example in the following text based on FIGS. 1 to 3, wherein identical reference signs in the figures indicate identical component parts with an identical function.

In the drawings.

DETAILED DESCRIPTION

Figure 1:
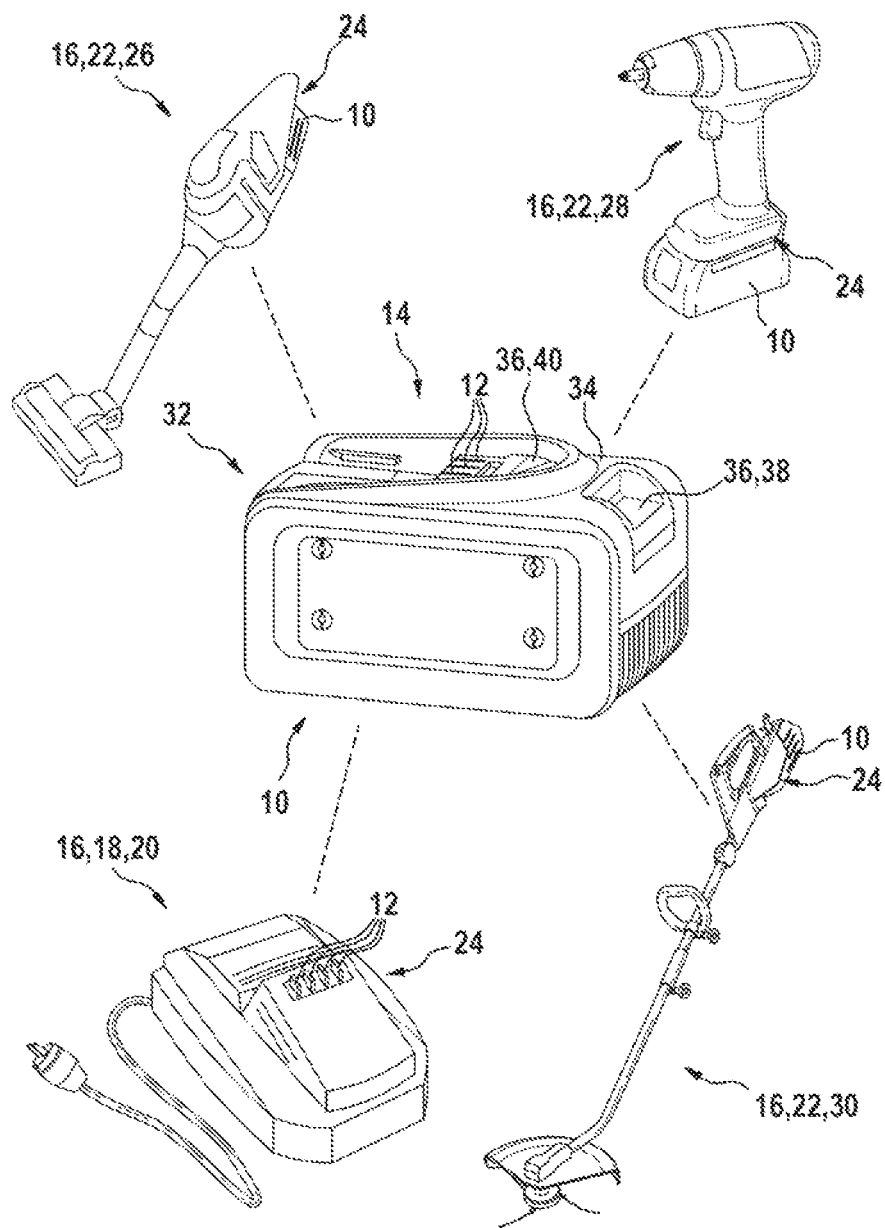
FIG. 1: shows a schematic illustration of a system comprising at least one removable battery pack and at least one electrical device that can be connected to the removable battery pack for charging or discharging the removable battery pack.

FIG. 1 shows a system comprising a removable battery pack 10 having a first electromechanical interface 14 having a plurality of electrical contacts 12 and an electrical device 16, in particular a charging device 18, a diagnostic device 20 or an electrical consumer 22, having a further electromechanical interface 24 having a plurality of electrical contacts 12. FIG. 1 is intended to illustrate that the system according to the disclosure is suitable for various electrical devices 16 operated using removable battery packs 10 without restricting the disclosure. In this case, a cordless vacuum cleaner 26, a cordless impact wrench 28 and a cordless lawn trimmer 30 are shown by way of example. In the context of the disclosure, however, a wide variety of power tools, gardening appliances and domestic appliances can be considered as electrical consumers 22. The number of removable battery packs 10 within the system can also be changed. The system can indeed also comprise several removable battery packs 10. It should furthermore be noted that, although in FIG. 1 the charging device 18 and the diagnostic device 20 are illustrated as one and the same electric device 16 because a charging device 18 can indeed also have a diagnostic function, it is conceivable, without restricting the disclosure, that the diagnostic device 20 does not have a charging function but serves only for pure diagnostics analysis of the removable battery pack 10 for electrical fault states.

The removable battery pack 10 is essentially a conventional removable battery pack having a housing 32, which has on a first side wall or the top side 34 thereof the first electromechanical interface 14 for detachable connection to the electromechanical interface 24 of the electrical device 16. In connection with the electrical consumer 22, the first and the further electromechanical interface 14, 24 primarily serve to discharge the removable battery pack 10 while, in connection with the charging device 18, it serves to charge and, in connection with the diagnostic device 20, it serves for fault diagnosis of the removable battery pack 10. The precise configuration of the first and the further electromechanical interface 14, 24 is dependent on different factors, such as the voltage class of the removable battery pack 10 or the electrical device 16 and various manufacturer specifications, for example. It is thus possible to provide, for example, three or more electrical contacts 12 for energy and/or data transmission between the removable battery pack 10 and the electrical device 16. Mechanical coding is also conceivable, such that the removable battery pack 10 can be operated only at specific electrical devices 16. Since the mechanical configuration of the first electromechanical interface 14 of the removable battery pack and the further electromechanical interface 24 of the electrical device 16 is insignificant for the disclosure, this will not be dealt with in more detail here. Both a person skilled in the art and an operator of the removable battery pack 14 and the electrical device 16 will make the suitable selection in this regard.

The removable battery pack 10 has a mechanical arresting apparatus 36 for arresting the form-fitting and/or force-fitting detachable connection of the first electromechanical interface 14 of the removable battery pack 10 at the corresponding mating interface 24 (not shown in detail) of the electrical consumer 22. In this case, the arresting apparatus 36 is designed as a sprung pushbutton 38, which is operatively connected to an arresting member 40 of the removable battery pack 10. Due to the suspension of the pushbutton 38 and/or the arresting member 40, the arresting apparatus 36 latches automatically into the mating interface 24 of the electrical consumer 22 when the removable battery pack 10 is inserted. If an operator presses the pushbutton 38 in the insertion direction, the arresting system is released and the operator can remove or eject the removable battery pack 10 from the electrical consumer 22 counter to the insertion direction.

As already mentioned at the beginning, the battery voltage of the removable battery pack 10 usually results from a multiple of the cell voltages of the energy storage cells (not shown) depending on their interconnection (in parallel or in series). The energy storage cells are preferably designed as lithium-based battery cells, for example Li-ion, Li—Po, Li-metal and the like. However, the disclosure can also be applied to removable battery packs with Ni—Cd, Ni-MH cells or other suitable cell types.

Figure 2:
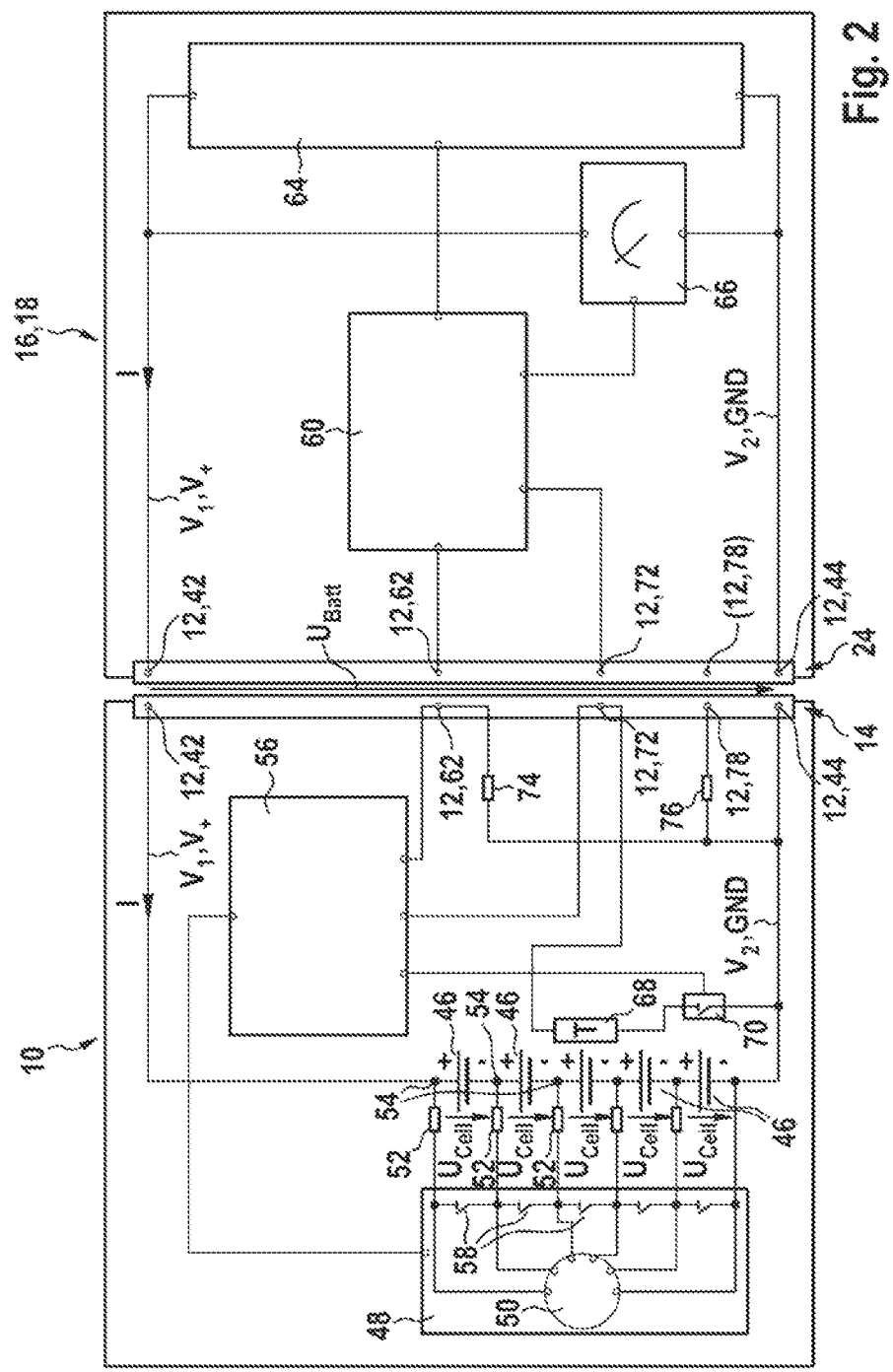
FIG. 2: shows the system from FIG. 1 as a block diagram with a removable battery pack and an electrical device designed as a charging device.

In FIG. 2, the system from FIG. 1 is illustrated as a block diagram with the removable battery pack 10 on the left-hand side and the electrical device 16 designed as a charging device 18 on the right-hand side. The removable battery pack 10 and the charging device 18 have the mutually corresponding electromechanical interfaces 14 and 24 having a plurality of electrical contacts 12, wherein in each case a first of the electrical contacts 12 of the interfaces 14, 24 serves as an energy supply contact 42 that can be supplied with a first reference potential $V_1$, preferably a supply potential $V_+$, and in each case a second of the electrical contacts 12 of the interfaces 14, 24 serves as an energy supply contact 44 that can be supplied with a second reference potential $V_2$, preferably a ground potential GND. On the one hand, the removable battery pack 10 can be charged by the charging device 18 via the first and the second energy supply contact 42, 44. On the other hand, discharge of the removable battery pack 10 is also effected via the same for the case that the electrical device 16 is designed as an electrical consumer 22. The term "can be supplied with" is intended to illustrate that the potentials $V_+$ and GND, in particular in the case of an electrical device 16 designed as an electrical consumer 22, are not permanently applied to the energy supply contacts 42, 44 but only after connection of the electrical interfaces 14, 24. The same applies for a discharged removable battery pack 10 after connection to the charging device 18.

The removable battery pack 10 has a plurality of energy storage cells 46, which, although they are illustrated in FIG. 2 as a series circuit, can alternatively or additionally also be operated in a parallel circuit, wherein the series circuit defines the voltage $U_{Batt}$ of the removable battery pack dropped across the energy supply contacts 42, 44, whereas a parallel circuit of individual energy storage cells 46 primarily increases the capacity of the removable battery pack 10. As already mentioned, individual cell clusters consisting of parallel-interconnected energy storage cells 46 can also be connected in series in order to achieve a specific voltage $U_{Batt}$ of the removable battery pack at the same time as an increased capacity. In current Li-ion energy storage cells 46 with a cell voltage $U_{Cell}$ of in each case 3.6 V, in the present exemplary embodiment a removable battery pack voltage $U_{Batt}=V_1-V_2$ of 5·3.6 V=18 V drops across the energy supply contacts 42, 44. Depending on the number of energy storage cells 46 connected in parallel in a cell cluster, the capacity of current removable battery packs 10 can be up to 12 Ah or more. However, the disclosure is not dependent on the type, design, voltage, current-delivering ability, etc. of the energy storage cells 46 used, but instead can be applied to any removable battery packs 10 and energy storage cells 46.

To monitor the individual series-connected energy storage cells 46 or cell clusters of the removable battery pack 10, an SCM (single cell monitoring) preliminary stage 48 is provided. The SCM preliminary stage 48 has a multiplexer measuring apparatus 50, which can be connected in a high-impedance manner to corresponding taps 54 of the poles of the energy storage cells 46 or cell clusters via filter resistors 52. To detect the individual cell voltages $U_{Cell}$, the multiplexer measuring apparatus 50 switches over sequentially between the individual taps 54, for example by means of integrated transistors, which are not shown in more detail, in such a way that it is connected in each case to a positive and a negative pole of the energy storage cell 46 to be measured or the cell cluster to be measured. In the following text, the term energy storage cell is also intended to include the cell cluster, since these only influence the capacity of the removable battery pack 10, but are synonymous for detecting the cell voltages $U_{Cell}$. The filter resistors 52, which are configured, in particular, in a high-impedance manner, can prevent dangerous heating of the measuring inputs of the multiplexer measuring apparatus 50, in particular in the event of a fault.

The switchover of the multiplexer measuring apparatus 50 is effected by means of a first monitoring unit 56 integrated in the removable battery pack 10. Said monitoring unit can additionally close or open switching elements 58 of the SCM preliminary stage 48 that are connected in parallel with the energy storage cells 46 in order in this way to effect what is known as balancing of the energy storage cells 46 to achieve uniform charging and discharging states of the individual energy storage cells 46. It is likewise conceivable that the SCM preliminary stage 48 passes the measured cell voltages $U_{Cell}$ directly through to the first monitoring unit 56 such that the actual measurement of the cell voltages $U_{Cell}$ is carried out directly by the first monitoring unit 56, for example by means of an appropriate analog-to-digital converter (ADC).

The first monitoring unit 56 can be designed as an integrated circuit in the form of a microprocessor, ASIC, DSP or the like. However, it is likewise conceivable that the monitoring unit 56 consists of a plurality of microprocessors or at least partly of discrete components with appropriate transistor logic. In addition, the first monitoring unit 56 can have a memory for storing operating parameters of the removable battery pack 10, such as, for example, the voltage $U_{Batt}$, the cell voltages $U_{Cell}$, a temperature T, a charging or discharge current I or the like.

In addition to the first monitoring unit 56 in the removable battery pack 10, the electrical device 16 of the system has a further monitoring unit 60, which can be designed correspondingly to the first monitoring unit 56. The first and the further monitoring unit 56 and 60, respectively, can exchange information, preferably digitally, via a third contact 12, designed as a signal or data contact 62, of the two electromechanical interfaces 14, 24.

The further monitoring unit 60 of the electrical device 16 designed as a charging device 18 controls a power output stage 64, which is connected to the first and the second energy supply contact 42, 44 of the further interface 24 and by means of which the removable battery pack 10 plugged into the charging device 18 can be charged using the charging current I and the voltage $U_{Batt}$ corresponding to the removable battery pack 10. For this purpose, the charging device 18 or the power output stage 64 is provided with a mains connection, which is not shown. The voltage $U_{Batt}$ applied to the energy supply contacts 42, 44 can be measured by means of a voltage measuring apparatus 66 in the charging device 18 and evaluated by the further monitoring unit 60. The voltage measuring apparatus 66 can also be integrated fully or partly in the monitoring unit 60, for example in the form of an integrated ADC.

A temperature T of the removable battery pack 10 or the energy storage cells 46 can be measured by means of a temperature sensor 68, which is arranged in the removable battery pack 10 and preferably designed as an NTC and is in close thermal contact with at least one of the energy storage cells 46, and evaluated by the further monitoring unit 60 of the charging device 18. To this end, the temperature sensor 68 is connected on one side to the second reference potential $V_2$, in particular to the ground potential GND, which is applied to the second energy supply contact 44 via a switching element 70, for example a bipolar transistor or MOSFET, which is integrated in the removable battery pack 10, and on the other side to a contact 12, designed as a signal or data contact 72, of the first interface 14 of the removable battery pack 10. A signal or data contact 72 is accordingly provided in the further interface 24 of the charging device 18, said contact being connected to the further monitoring unit 60. Furthermore, a connection exists between the signal or data contact 72 of the first interface 14 of the removable battery pack 10 and the first monitoring unit 56 of the removable battery pack 10. Via said connection, the first monitoring unit 56 can determine whether the temperature T measured by the temperature sensor 68 has been requested by the further monitoring unit 60 of the charging device 18. If this is the case, the first monitoring unit 56 is transferred automatically from a quiescent mode to an operating mode. If there has been no such request, the quiescent mode allows the first monitoring unit 56 significantly longer idle and storage times of the removable battery pack 10 due to the reduced quiescent current.

In order that the charging device 18 can identify the removable battery pack 10 and, if necessary, enable it for charging, the removable battery pack 10 has a first coding resistor 74, which is connected on one side to the second reference potential $V_2$, in particular to the ground potential GND, which is applied to the second energy supply contact 44 and on the other side to the third contact 12, designed as a signal or data contact 62, of the first interface 14 of the removable battery pack 10. If the resistance value of the first coding resistor 74 corresponds to a value stored in the further monitoring unit 56 of the charging device 60, the charging device 18 enables the charging process and charges the removable battery pack 10 according to the charging parameters stored in a look-up table, in particular the charging current I, the charging voltage $U_{Batt}$, the permissible temperature range, etc. In addition to the first coding resistor 74, a second coding resistor 76 is provided in the removable battery pack 10, said second coding resistor being connected, in a manner corresponding to the first coding resistor 74, to the second reference potential $V_2$ and a further contact 12, designed as a signal or data contact 78, of the first interface 14 of the removable battery pack 10. An electrical device 16 designed as an electrical consumer 22 can enable the discharge process of the removable battery pack 10 by means of the second coding resistor 76. To this end, analogously to the charging device 18, the electrical consumer 22 has a further monitoring unit 60, which requests the resistance value of the second coding resistor 76 by means of a contact 12, designed as a signal or data contact 78, of the further interface 24 and compares it with a stored value. If the values do not correspond, the discharging process of the removable battery pack 10 is terminated or not permitted, with the result that the electrical consumer 22 cannot be set into operation. When they correspond, an operator can set the electrical consumer 22 into operation. This particularly advantageously allows operation of removable battery packs 10 of different power classes with identical electromechanical interfaces 14 or 24. It is self-evident that, in the case of an electrical consumer 22, the power output stage 64 contained in the charging device 18 is designed as a drive unit, for example as an electric motor (possibly with power output stage accordingly connected upstream) or another unit that consumes energy. The configuration of such a unit will not be dealt with further here since it is well known to a person skilled in the art for a wide variety of types of electrical consumers 22 and also does not have any critical importance for the disclosure.

Figure 3:
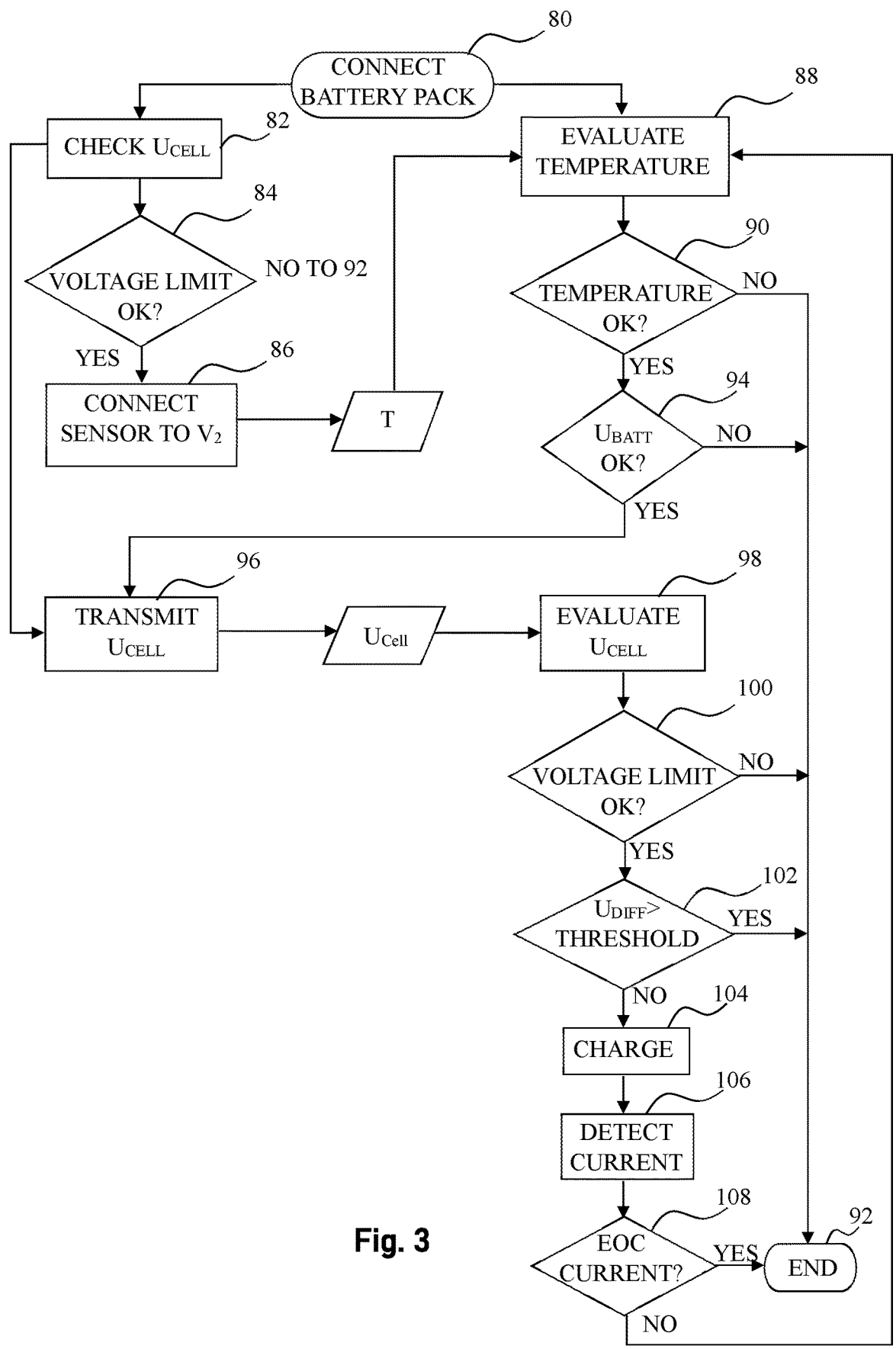
FIG. 3: shows a flowchart of the method according to the disclosure.

FIG. 3 shows a flowchart of the method according to the disclosure that can be carried out using the system described in FIG. 2. In a first method step 80 of the method, the removable battery pack 10 is connected via its first electromechanical interface 14 to the further electromechanical interface 24 of the electrical device 16. In the following text, it is to be assumed that the electrical device 16 is designed as a charging device 18 according to FIG. 2. However, the method can likewise be carried out using a system in which the electrical device 16 is designed as an electrical consumer 22 or as a diagnostic device 20.

For the purpose of better clarity, the method steps illustrated on the left-hand side of the flowchart are carried out in the removable battery pack 10 and the method steps illustrated on the right-hand side are carried out in the charging device 18.

In a subsequent method step 82, the first monitoring unit 56 of the removable battery pack 10 uses stored lower and upper voltage limit values to check whether the cell voltages $U_{Cell}$ detected by means of the multiplexer measuring apparatus 50 satisfy the voltage limit values. If this is the case in method step 84, in method step 86 the first monitoring unit 56 connects the temperature sensor 68 to the second reference potential $V_2$, in particular to the ground potential GND, by means of the switching element 70.

The temperature T of the removable battery pack 10 or of the energy storage cells 46 measured in method step 86 is requested by the further monitoring unit 60 of the charging device 18 via the signal or data contact 72 of the interfaces 14, 24 and evaluated in method step 88. If the temperature T in method step 90 is outside of a permissible temperature range of, for example, 10 to 60° C., in method step 92 the charging process is ended or not started by the further monitoring unit 60 of the charging device 18. As an alternative, the charging process can also be started with a reduced charging current I if there is only a slight undershooting or exceeding of the temperature limit values in method step 90.

If at least one of the detected cell voltages $U_{Cell}$ is outside of the permitted voltage limit values, the switching element 70 remains open in method step 86. The non-activation of the temperature sensor 68 by the first monitoring unit 56 in method step 86 can be detected by the further monitoring unit 60 in the charging device 16 via the signal or data contact 72, with the result that it terminates or does not start the charging process of the removable battery pack 10 in method step 92 and/or displays a corresponding fault state on the charging device 18.

In the subsequent method step 94, the voltage $U_{Batt}$ of the removable battery pack 10 is checked by means of the further monitoring unit 60 of the charging device 18. If this voltage is outside of a permitted operating range, for example because the removable battery pack has been deep-discharged, in method step 92 the charging process of the removable battery pack 10 is ended or not started by the further monitoring unit 60 and/or a corresponding fault state is displayed on the charging device 18. If the voltage $U_{Batt}$ of the removable battery pack 10 is within the permitted operating range, the further monitoring unit 60 then requests via the signal or data contact 62 of the interfaces 14, 24 the cell voltages $U_{Cell}$ measured in method step 82, the cell voltages in turn being transmitted in method step 96 by the first monitoring unit 56 of the removable battery pack 10 to the further monitoring unit 60 via the signal or data contact 62 and being evaluated by the further monitoring unit in method step 98.

In method step 100, in a manner analogous to method step 82, the further monitoring unit 60 uses stored lower and upper voltage limit values to check whether the cell voltages $U_{Cell}$ detected by means of the multiplexer measuring apparatus 50 of the removable battery pack 10 satisfy the voltage limit values. If at least one of the transmitted cell voltages $U_{Cell}$ is outside of the permitted voltage limit values, in method step 92 the charging process of the removable battery pack 10 is ended or not started by the further monitoring unit 60 and/or a corresponding fault state is displayed on the charging device 18.

Otherwise, the transmitted voltages $U_{Cell}$ are summed in method step 102 and compared with the voltage $U_{Batt}$ of the removable battery pack 10 checked in method step 94. In method step 92, the further monitoring unit 60 of the charging device 18 terminates the charging process of the removable battery pack 10 or does not start the charging process when the voltage value $U_{Batt}$ of the removable battery pack 10 and the summed cell voltage values $U_{Cell}$ of the energy storage cells 46 differ from one another by more than a permissible voltage difference value $U_{Diff}$, in particular by more than 1 V. In this case, too, the fault state can additionally be displayed on the charging device 18 in a manner analogous to the previous method step.

If the voltage difference $|U_{Batt}-\Sigma U_{Cell}|$ calculated in method step 102 is below the permissible voltage difference value $U_{Diff}$, in method step 104 the charging process is continued or started and an appropriate charging current I, for example in accordance with a constant-current charging method, and an appropriate end-of-charge voltage, for example in accordance with a constant-voltage charging method, is set by the further monitoring unit 60.

In method step 106, the charging current I is detected by the further monitoring unit 60 of the charging device 18 and in method step 108 is compared with a permissible end-of-charge current value, for example 100 mA per cell cluster or energy storage cell 46. If the measured charging current I is below the end-of-charge current value, the charging process of the removable battery pack 10 is ended by the further monitoring unit 60 in method step 92. Otherwise, the charging process is continued in method step 88 until the charging process is eventually ended in method step 92. In this case, the previous method steps are run through repeatedly at time intervals of, for example, one minute in order to ensure continuous monitoring. If there is still no fault state present after several runs through, the time intervals can be increased successively.

It is furthermore conceivable that the charging process is started or continued with a reduced charging current I when the instances of undershooting or exceeding of the limit values identified in the previous method steps are within a tolerance range, for example 1 to 5%.

To display the detected fault states, the charging device 18 and/or the removable battery pack 10 have a corresponding display, not shown in more detail, in the form of an LED, a display screen and/or an optical signal generator. If the electrical device 18 is designed as a diagnostic device 20 or an electrical consumer 22, the display can additionally or alternatively also be designed as a haptic signal generator, for example in the form of a vibration motor. In the case of an electrical consumer 22 driven by electric motor, it is also conceivable that a drive motor for an insert tool serves as haptic and/or acoustic signal generator.

Finally, it should be pointed out that the exemplary embodiments shown are restricted neither to FIGS. 1 to 3 nor to the number and type of removable battery packs 10 and electrical devices 16 shown therein. The same applies to the number of energy storage cells 46. The configurations of the interfaces 14, 24 and the number of contacts 12 thereof shown should be understood as purely exemplary.

What is claimed is:

1. A method for detecting electrical fault states of a removable battery pack, comprising:
   detecting cell voltage values of a plurality of energy storage cells of the removable battery pack using a first monitoring unit integrated in the removable battery pack;
   detecting an output voltage value of the removable battery pack using a second monitoring unit integrated in an electrical device connected to the removable battery pack;
   transmitting the detected cell voltage values to the second monitoring unit;

summing the transmitted cell voltage values with the second monitoring unit;
comparing the summed cell voltage value with the detected output voltage value of the removable battery pack; and
terminating or reducing a charging or discharging process of the removable battery pack based upon the comparison.

2. The method according to claim 1, further comprising:
evaluating the transmitted cell voltage values using the second monitoring unit, wherein
terminating or reducing the charging or discharging process of the removable battery pack further comprises terminating or reducing the charging or discharging process of the removable battery pack when, according to the evaluation, at least one of the cell voltage values exceeds a cell voltage threshold value.

3. The method according to claim 1, further comprising:
measuring a temperature of the removable battery pack and/or of the plurality of energy storage cells; and
evaluating the measured temperature using the second monitoring unit.

4. The method according to claim 3, wherein:
terminating or reducing the charging or discharging process of the removable battery pack further comprises terminating or reducing the charging or discharging process of the removable battery pack using the second monitoring unit when the evaluated temperature value is outside of a permitted temperature range and/or the output voltage value of the removable battery pack is outside of a permitted voltage range.

5. The method according to claim 1, further wherein:
terminating or reducing the charging or discharging process of the removable battery pack further comprises terminating or reducing the charging or discharging process of the removable battery pack using the second monitoring unit when the output voltage value of the removable battery pack and the summed cell voltage value of the plurality of energy storage cells deviate from one another by more than a permissible voltage difference value.

6. The method according to claim 5, further comprising:
evaluating a charging or discharge current using the second monitoring unit of the electrical device; and
terminating or reducing the charging process and/or signaling the electrical fault state, using the second monitoring unit, when the charging or discharge current is outside of a permitted current range and/or below an end-of-charge current value.

7. The method according to claim 6, further comprising:
continuing the charging or discharging process after a time interval when no electrical fault state has been identified.

8. A system comprising:
a removable battery pack including a plurality of energy storage cells, a first monitoring unit, and a first electromechanical interface having a first plurality of electrical contacts; and
an electrical device including a second monitoring unit and a second electromechanical interface having a second plurality of electrical contacts,
wherein in each of the first and second plurality of electrical contacts (i) a first electrical contact is configured as an energy supply contact that can be supplied with a first reference potential, (ii) a second electrical contact is configured as an another energy supply contact that can be supplied with a second reference potential, and (iii) a third electrical contact is configured as a signal or data contact configured to exchange data between the first and the second monitoring unit, and
wherein the system is configured to detect electrical fault states of the removable battery pack, the system configured to:
detect cell voltage values of the plurality of energy storage cells using the first monitoring unit,
detect an output voltage value of the removable battery pack using the second monitoring unit,
transmit the detected cell voltage values to the second monitoring unit,
sum the transmitted cell voltage values with the second monitoring unit, and
compare the summed cell voltage value with the detected output voltage value of the removable battery pack.

9. The system according to claim 8, wherein:
the removable battery pack further includes at least one temperature sensor,
in each of the first and second plurality of electrical contacts a fourth electrical contact is configured as a signal or data contact configured to transmit a temperature signal of the at least one temperature sensor to the second monitoring unit.

10. The system according to claim 9, wherein:
the removable battery pack has a switching element,
in a closed state of the switching element, the switching element connects the temperature sensor to the second reference potential, and
in an open state of the switching element, the switching element disconnects the temperature sensor from the second reference potential.

11. The system according to claim 8, wherein the removable battery pack and/or the electrical device each have an optical signaling device, an acoustic signaling device, and/or a haptic signaling device configured to signal the fault state.

* * * * *